(12) United States Patent
Rhie

(10) Patent No.: US 9,236,127 B2
(45) Date of Patent: Jan. 12, 2016

(54) NONVOLATILE SEMICONDUCTOR MEMORY DEVICE

(71) Applicant: Conversant IP Management Inc., Plano, TX (US)

(72) Inventor: Hyoung Seub Rhie, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 14/503,709

(22) Filed: Oct. 1, 2014

(65) Prior Publication Data

US 2015/0103600 A1    Apr. 16, 2015

Related U.S. Application Data

(60) Provisional application No. 61/889,589, filed on Oct. 11, 2013.

(51) Int. Cl.
| | | |
|---|---|---|
| *G11C 16/04* | (2006.01) | |
| *H01L 27/115* | (2006.01) | |
| *H01L 29/66* | (2006.01) | |

(52) U.S. Cl.
CPC ........ *G11C 16/0483* (2013.01); *G11C 16/0466* (2013.01); *H01L 27/11578* (2013.01); *H01L 29/66833* (2013.01)

(58) Field of Classification Search
CPC ..................... H01L 27/0207; H01L 27/11565; H01L 27/11578; G11C 16/0483; G11C 16/0466
See application file for complete search history.

(56) References Cited

U.S. PATENT DOCUMENTS

| | | | |
|---|---|---|---|
| 2012/0181580 A1 | 7/2012 | Lue et al. | |
| 2012/0181699 A1 | 7/2012 | Chen et al. | |
| 2012/0182802 A1 | 7/2012 | Hung et al. | |
| 2012/0182806 A1* | 7/2012 | Chen ................ | H01L 27/11573 365/185.17 |
| 2013/0003434 A1 | 1/2013 | Lue et al. | |
| 2013/0181184 A1* | 7/2013 | Sakuma .......... | H01L 21/823431 257/5 |
| 2015/0098274 A1* | 4/2015 | Rhie .................. | G11C 16/0483 365/185.17 |
| 2015/0262669 A1* | 9/2015 | Kamata .................. | G11C 16/08 365/185.05 |

FOREIGN PATENT DOCUMENTS

| | | |
|---|---|---|
| CN | 102610259 A | 7/2012 |
| EP | 2631947 A1 | 8/2013 |

OTHER PUBLICATIONS

H. Tanaka, "Bit Cost Scalable Technology with Punch and Plug Process for Ultra High Density Flash Memory," 2007 Symposium on VLSI Technology Digest of Technical Papers.

(Continued)

*Primary Examiner* — Allison P Bernstein
(74) *Attorney, Agent, or Firm* — Daniel Hammond

(57) ABSTRACT

A non-volatile memory device, including: a substrate; a plurality of string stacks disposed over the substrate, each string stack including a long axis and a short axis in a plane parallel to the substrate, the long axis extending along a y-direction and the short axis extending along an x-direction, each string stack including a plurality of strings being stacked in a direction vertical to the substrate and having a first end and a second end at different locations in the y-direction, the plurality of string stacks including a first and a second set of string stacks, at least some of the string stacks of the first set of string stacks being offset along the x-direction from at least some of the string stacks of the second set of string stacks.

12 Claims, 8 Drawing Sheets

(56) References Cited

OTHER PUBLICATIONS

Jaehoon Jang et al. "Vertical Cell Array using TCAT(Terabit Cell Array Transistor) Technology for Ultra High Density NAND Flash Memory," 2009 Symposium on VLSI Technology Digest of Technical Papers.

Fukuzumi et al., "Optimal Integration and Characteristics of Vertical Array Devices for Ultra-High Density, Bit-Cost Scalable Flash Memory," IEEE International Electron Devices Meeting, 2007. JIEDM 2007, pp. 449-452.

A. Hubert et al., "A stacked SONOS technology, up to 4 levels and 6nm crystalline nanowires, with Gate-All-Around or Independent gates (cp-Flash), suitable for full 3D integration," Electron Devices Meeting (IEDM), 2009 IEEE International, pp. 1-4.

H. T. Lue et al., "A Highly Scalable 8-Layer 3D Vertical-Gate (VG) TFT NAND Flash Using Junction-Free Buried Channel BE-SONOS Device," 2010 Symposium on VLSI Technology (VLSJT), pp. 131-132.

C.-P. Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symposium on VLSI Technology (VLSIT), pp. 91-92.

K.-P. Chang et al., "Memory Architecture of 3D Vertical Gate (3DVG) NAND Flash Using Plural Island-Gate SSL Decoding Method and Study of it's Program Inhibit Characteristics," 2012 4th IEEE International Memory Workshop (IMW), pp. 1-4.

S.-H. Chen, "A Highly Scalable 8-Layer Vertical Gate 30 NAND with Split-page Bit Line Layout and Efficient Binary-sum MiLC (Minimal Incremental Layer Cost) Staircase Contacts," 2012 IEEE International Electron Devices Meeting (IEDM).

C.-H. Hung "Design Innovations to Optimize the 3D Stackable Vertical Gate (VG) NAND Flash," 2012 IEEE International Electron Devices Meeting (IEDM).

H.T Lue et al., "A Novel Junction-Free BE-SONOS NAND Flash," 2008 Symposium on VLSI Technology Digest of Technical Papers.

\* cited by examiner

NONVOLATILE SEMICONDUCTOR MEMORY DEVICE

CROSS-REFERENCE TO RELATED APPLICATION

This application claims the benefit under 35 U.S.C. §119 (e) of U.S. Provisional Application No. 61/889,589, filed Oct. 11, 2013, entitled "Nonvolatile Semiconductor Memory Device." U.S. Provisional Application No. 61/889,589 includes exemplary systems and methods and is incorporated by reference in its entirety.

BACKGROUND

1. Field

The present disclosure generally relates to a semiconductor device. More particularly, the present disclosure relates to a non-volatile memory such as a flash memory device.

2. Description of the Related Art

With the increasing demand for nonvolatile data storage in consumer electronics having mass storage, such as video or audio players, digital cameras, and other computerized devices, there continues to be interest in having nonvolatile memory devices progress over time towards having smaller sizes, larger memory capacity, and improved performance. Flash memory is a commonly used type of nonvolatile memory which can take the form of memory cards or USB type memory sticks, each having at least one memory device and a memory controller formed therein.

SUMMARY

It is therefore one goal of the current disclosure to provide an improved layout which facilitates ion implantation. More specifically, in certain embodiments, the improved layout includes certain regions of a VG NAND structure which cannot be easily controlled by an adjacent gate node. In certain embodiments, these regions include bit line pads which are not in the immediate vicinity of any gate node. In certain embodiments, a junction-free source/drain scheme applies to semiconducting regions in the immediate vicinity of transistor gates, and furthermore induces conductive regions in case these transistors in the immediate vicinity are turned on. However, bit line pads should be conductive even in cases where some adjacent transistors are in a turned off state. For example, if a read operation is performed on a string, a continuous conductive path should be formed from the bit line through the contact through the bit line pad to the string channel of another string, regardless of whether or not the SSL gate of other strings is in a turned on state. Accordingly, the current disclosure provides a method to fabricate the bit line pads with a permanent conductivity to form a permanent conductive path from the bit line to each SSL transistor drain.

In accordance with at least some example embodiments, the layout facilitates sidewall ion implant processes, as regions which are implanted from a positive y-direction and a negative y-direction naturally overlap with each other. Therefore with embodiments of the present disclosure the implanted regions are not disconnected from each other but form one connected n-type region throughout the bit line pad. Such a layout diminishes the need for any additional measures to decrease bit line pad resistance.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
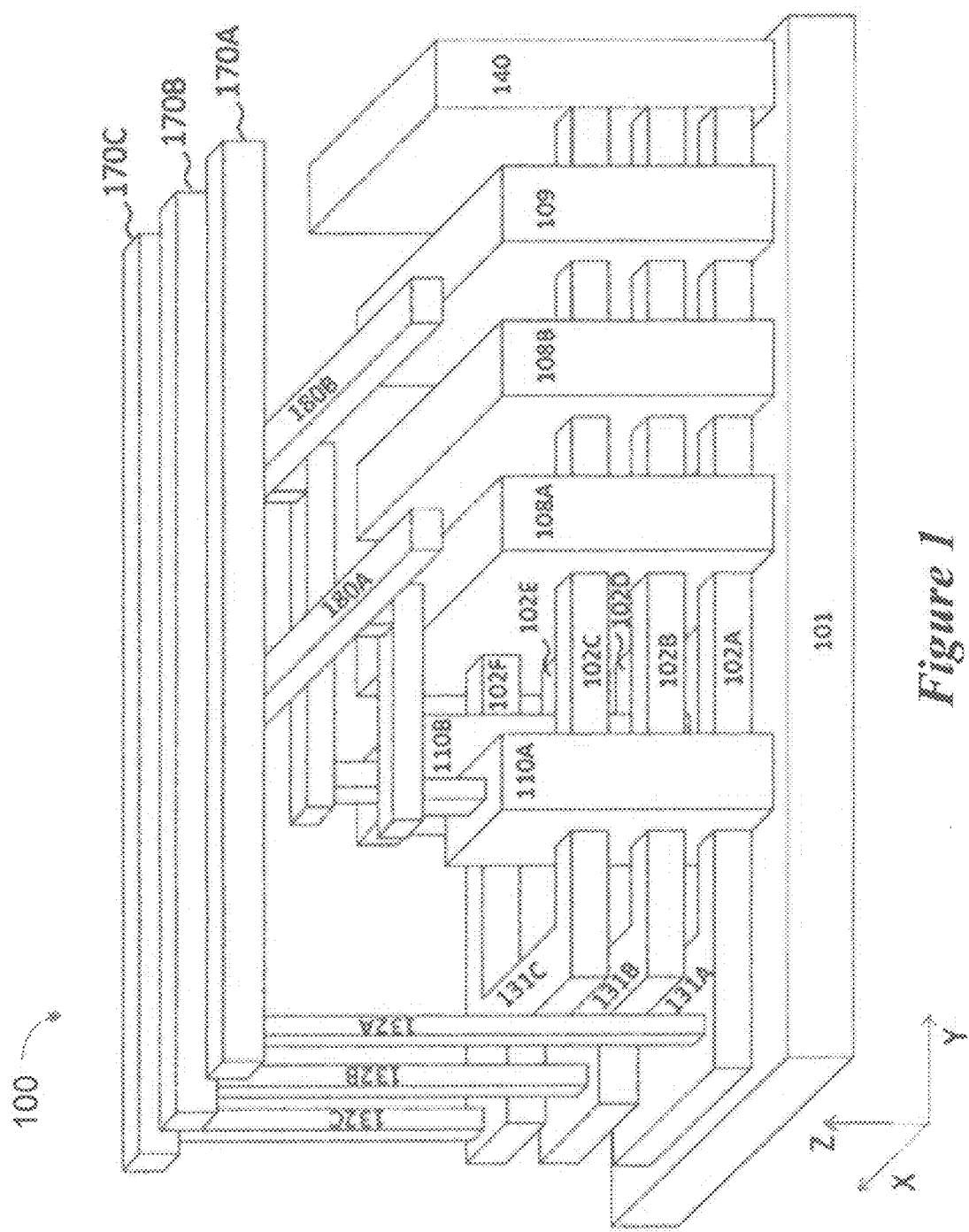
FIG. 1 shows a 3D representation of a VG NAND structure with island SSL gates.

The need to reduce manufacturing costs per data bit is driving the NAND flash industry to continuously reduce the size of the cell transistors. But as fabrication process limitations (for example, limitations imposed by photolithography tools) limit the ability to reduce physical transistor sizes, there have been structural and/or design schemes proposed to increase memory density, such as, for example, stacking NAND cells in a direction perpendicular to the chip surface, thereby reducing the effective chip area per data bit without requiring shrinkage of the physical cell transistor size. However, there continue to be challenges associated with designing, fabricating, and operating vertical NAND flash memory devices.

Some systems may provide two different types of stacked NAND devices a geometrical point of view. With a first type of stacked NAND devices, cell strings are configured to run in a direction perpendicular to the chip substrate, whereby cells which belong to the same string are stacked vertically on top of each other. With a second type of stacked NAND devices, cell strings run in a direction parallel to the chip substrate, whereby cells which belong to the same string are aligned in a direction parallel to the chip surface, but different strings are stacked vertically on top of each other. Hereinafter, NAND Flash which correspond to the second type of stacked NAND devices is referred to as Vertical Gate NAND or VG NAND and NAND Flash which correspond to the first type of stacked NAND devices is referred to as Vertical Channel or VC NAND, regardless of the specific details of the cell transistor internal structure. Furthermore whenever a direction is referred to as "vertical" without further specification this has the meaning of the direction being perpendicular to the chip surface.

Three-dimensional cell arrays, and among them VG NAND cell arrays in particular, are subject to some constraints that are not present in two-dimensional cell arrays. One such constraint is that it is difficult to isolate word line nodes for cells which are stacked vertically on top of each other. Another issue that is specific to three-dimensional NAND Flash devices is how to dope semiconductor structures of the devices with a desired impurity type to make the structures conductive. One cause of this issue is that in three-dimensional NAND Flash devices, multiple semiconducting layers are stacked vertically on top of each other and may therefore mask each other during an ion implantation process. Ion implantation is a highly directional process and often requires a straight free path from the source of the ions to the target silicon surface. In two-dimensional NAND Flash devices there exists only one layer of semiconducting silicon substrate, which is therefore freely accessible from an ion source located above the wafer, and any location on the chip is therefore accessible through a free path for ion bombardment, at least during the front end of the manufacturing process when there are not any structures built on the semiconductor substrate yet. Therefore the layout of a two-dimensional NAND Flash device may not need to take this factor into account.

In a three-dimensional NAND Flash device, it is desirable to provide methods for making bit line pads and the source/drain regions between word lines, string selection lines (SSLs) and ground selection lines (GSLs) n-type conductive. Additionally, it is desirable to make adjustments in the fabrication of three-dimensional NAND Flash devices to overcome the afore-mentioned challenges and issues.

Figure 2:
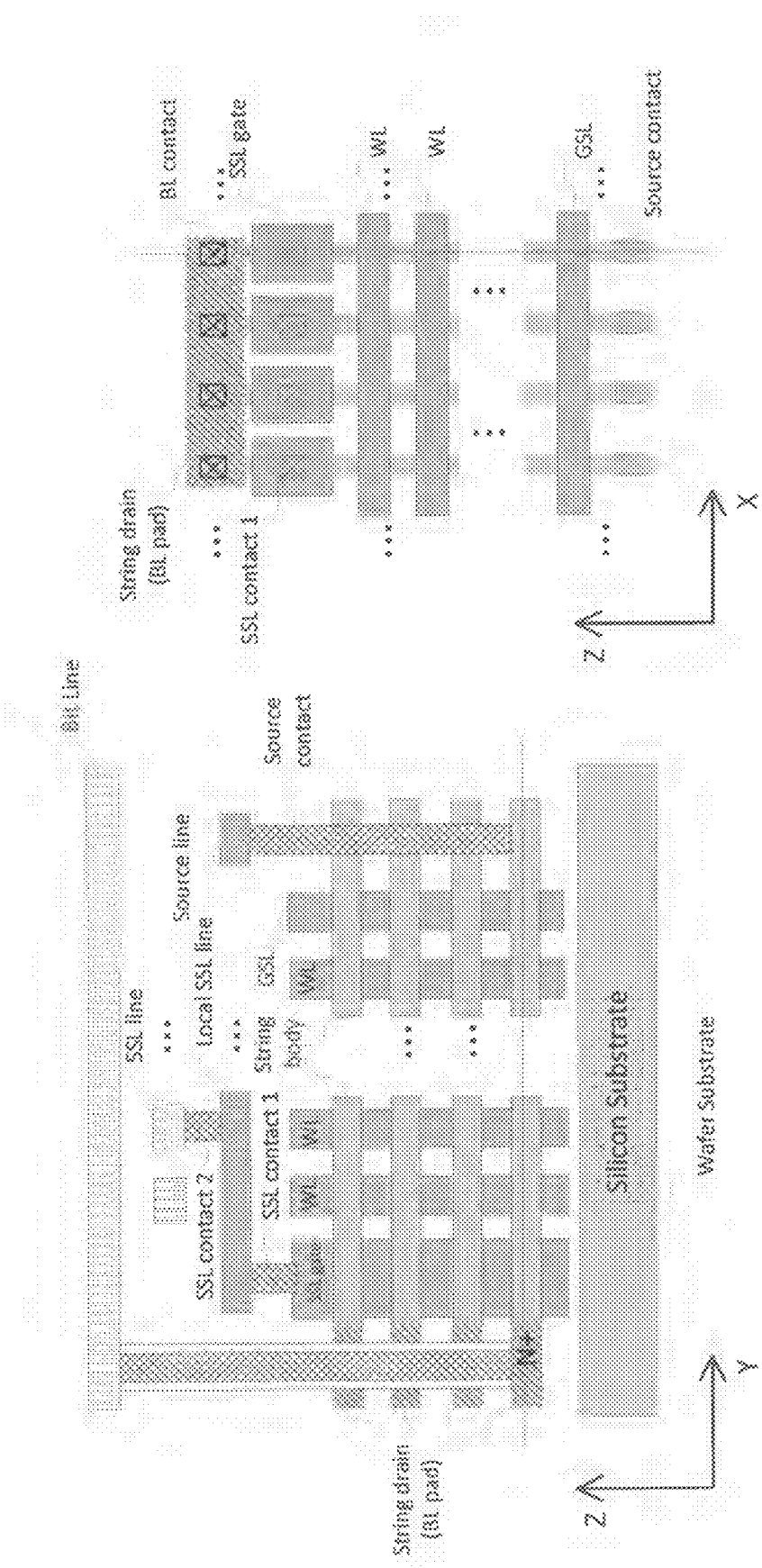
FIG. 2 shows a vertical cross section (left) and top view layout (right) of a tile of a VG NAND structure.

Referring to FIGS. 1 and 2, a three-dimensional array architecture of an example vertical gate NAND flash memory 100 is shown. The VG NAND flash memory 100 may be configured to include offset string stacks in accordance with various embodiments of the present disclosure. It will be appreciated that the exact manner in which the various elements of the VG NAND flash memory 100 are electrically connected as well as various features such as the island SSLs, the plate-shaped word lines etc. are just example configurations, not essential elements of the disclosure. Referring now to FIG. 1, a three-dimensional array architecture of the example vertical gate NAND flast memory 100 is shown. In the VG NAND flash memory 100, a plurality of stacked cell strings 102A-F are formed over a chip substrate 101 to extend through separate word line gate structures 108A, 108B, with each cell string running in a direction (e.g., y direction) that is parallel to the surface of the chip substrate 101. The layout of the VG NAND 100 resembles a conventional NAND memory, but with word lines and bit lines grouped in each plane and with string select transistors connecting each string to a corresponding bit line pad 131A-C.

Each NAND string is formed with a silicon strip (for example, patterned poly layer 102A) in which channels are formed to run in a horizontal direction that is parallel to the chip surface, with different NAND strings (for example, patterned poly layers 102B, 102C) stacked on top of each other. In the illustrated example, the cell transistors formed along each silicon strip (for example, 102A-C) are formed as dual gate devices by forming a word line gate structure 108A, 108B with multi-layered memory film structure (not shown) to surround the silicon strip with opposing gates where each cell channel is formed. It will be appreciated that other gate structures such as gate-all-around gate structures are also contemplated. Though not separately shown, it will be appreciated that each multi-layered memory film structure formed around each string for each memory cell transistor may include a tunnel dielectric layer formed to surround the channel region of the silicon strip, a charge storage layer (for example, charge-trapping layers such as silicon nitride) formed around the tunnel dielectric layer, and a coupling dielectric formed around the charge storage layer. Around each multi-layered memory film structure, a word line gate structure 108A, 108B may be formed with one or more patterned polysilicon layers to extend across multiple strings in a word line direction (e.g. x direction). In addition, the transistors formed in each silicon strip may include implanted and/or diffused source/drain regions (for example, n+ regions) on at least the string select transistor and ground select transistor, if not also the memory cell transistors. In other embodiments, the memory cell transistors may be formed as junction-free cells with virtual source/drain regions formed to have conductivity that depends on the existence of electric fringe fields between gates adjacent to the source/drain regions and the source/drain silicon itself.

In addition to the separate word line gate structures 108A, 108B defining multiple memory cells, each string also includes additional gate structures on each end of the string to define ground and string select line transistors. For example in the illustrated embodiment, the ground select line transistors may be formed with a poly gate structure 109 which connects the source node of each stacked string 102A-F to a shared or common source line 140, while string select transistors may be formed with separate poly gate structures 110A, 110B, each of which connects the drain nodes of vertically stacked strings 102A-F to a corresponding bit line pad 131A-C under control of a string select signal applied via metal line conductors 180A, 180B and contacts 150, 151. In this way, the source node of each string is shared with adjacent strings that are located above or below it in a vertical direction via a source contact using the common source line 140, but the drain node of each string (e.g., 102C) is shared only horizontally with other strings (e.g., 102F) via a bit line pad (e.g., 131C), but not vertically. If desired, the ground and string select transistors may be formed as dual gate devices substantially as described above. For example, the string select transistor at the drain node of each string may be formed with a poly gate structure (for example, 110A, 110B) formed around a multi-layered memory film structure, while the ground select transistor at the source node of each string may be formed with a poly gate structure 109 formed around a multi-layered memory film structure.

By forming each word line gate structure 108A-B around the multi-layered memory film structures to extend horizontally across separate vertical stacks of silicon strips (for example, 102A-C and 102D-F), separate word line (WLi) signals may be connected to each poly gate node 108A-B of the cell transistors in a horizontal. In addition, each cell transistor shares its poly gate node 108A-B (and applied word line WLi signal) with all cell transistors that are stacked vertically above it. Bit lines can also be shared by one or more strings formed in the same layer (for example, 102A, 102D) by connecting the strings to a shared bit line pad (for example, 131A) which is used to establish electrical connection from the connected strings to the common bit line (for example, 170A) through one or more via contacts or conductors 132A. In similar fashion, strings formed in another layer (for example, 102B, 102E) may be connected to a shared bit line pad (for example, 131B) which is electrically connected to a second common bit line (for example, 170B) through one or more via contacts or conductors 132B, while strings formed in another layer (for example, 102C, 102F) may be connected to a shared bit line pad (for example, 131C) which is electrically connected to another common bit line (for example, 170C) through one or more via contacts or conductors 132C.

Extending across all stacked cell strings 102A-C and 102D-F, the poly gate structure 109 for the shared ground select transistor connects the source nodes of stacked strings 102A-C and 102D-F to the common source line contact 140.

In contrast, each poly gate structure 110A, 110B for a given string select transistor does not extend across multiple strings in the same plane, but is instead formed as an island SSL gate (e.g., 110A), so that each string (for example 102A) shares a common SSL gate (for example, 110A) with the vertically stacked strings (for example, 102B, 102C), but not any strings (for example, 102D) in the same plane.

The depicted vertical gate NAND flash memory 100 illustrates selected example embodiments for a three-dimensional array architecture of a vertical gate NAND flash memory which allows individual pages to be selected for read and program operations and which may erase selected blocks in a VG NAND structure. However, it will be appreciated that a vertical gate NAND flash memory may be implemented with different features and structures. For example, the common source line contact 140 may be formed with a different shape or structure, such as a using a plate-shaped layer and/or a conductive line that runs in a horizontal direction and connects vertically to an additional metal line which runs in a horizontal direction. In addition, the arrangement and connection of stacked cell strings 102A-F may be oriented to all run in the same direction, to run alternating strings in opposite directions, or with any desired orientation of different strings. In addition, any desired alignment, shape, and positioning of the island-type string select poly gate structures (for example, 110A, 110B) and/or bit line pads (for example, 131A-C) may be used to establish electrical connection to the metal layers 170A-C through respective via contacts 152-154. It will also be appreciated that the illustrated vertical gate NAND flash memory 100 shows conductive elements, such as interconnections, contacts, string bodies and gate material, to highlight the connectivity of the constituting elements, but does not show isolating materials such as gate dielectrics, interlayer dielectrics, inter-metal dielectrics, etc. Persons skilled in the art will understand that dielectric layers are located around the conductor elements to provide electrical isolation. It will also be appreciated that embodiments of reverse polarity (i.e., where the pads in the structure are source line pads rather than bit line pads) are also contemplated.

The current disclosure will be described based on a specific example of the general VG NAND cell structure 100. Before describing the distinctive features of the current disclosure, a brief description of the basic example cell structure will be provided with reference to FIG. 2, in which one tile is shown. The illustrated structure is one embodiment of the general VG NAND structure described with reference to FIG. 1. FIG. 2 shows only the internal structure of a single tile. The features of the current disclosure become more apparent only the description of at least two tiles in relation to each other.

Referring now to FIG. 2, the silicon strips comprising the channels of the NAND strings run in a horizontal direction and are stacked vertically on top of each other in four layers which are separated by dielectric layers. Word lines and the GSL line connect gate nodes of cell transistors in the x-direction. In addition each cell transistor, SSL transistor or GSL transistor shares its gate node with transistors that are located in a vertical direction from it. Cell transistors are formed at the intersections between silicon strips and word lines. The cell transistors, SSL transistors and GSL transistors are formed as dual gate devices with channels existing on the sidewalls and gates also facing the sidewalls of the silicon strips which constitute the strings. It will be appreciated that other gate structures such as gate-all-around structures are also contemplated).

In the illustrated example of one tile, four strings belonging to the same vertical layer are connected to one common bit line pad, resulting in sixteen strings in the illustrated structure (e.g., four (number of bit line pads) times four (strings per bit line pad)=sixteen strings). The tile structure shown in FIG. 2 is repeated in the x-direction and also in the y-direction. The bit line pads are of n-type conductivity. The n-type conductivity is fabricated through tilted sidewall ion implantation, during a manufacturing step when the string and bit line pad structure already exists and is exposed, however when other elements like transistor gates, contacts or metal lines are not fabricated yet. For the purposes of this disclosure tilted refers to the direction of ion bombardment and corresponds to substantially 45 degrees where substantially corresponds to a direction which is less than vertical but more than horizontal relative to the sidewall. Contrary to the word lines or GSL lines, SSL gates are island-shaped, so that each string shares a common SSL gate with all strings that are located above or below it in a vertical direction, but does not share with any string that is located in a horizontal direction from it. The island SSL gates are connected to different SSL lines so that depending on which SSL line is selected different string stacks can be selected for read or program operation.

Each of the four bit line pads is connected to one dedicated contact via. Each of the four contact vias is connected to one dedicated bit line. Thus each bit line pad is connected to one dedicated bit line. When landing on a bit line pad which is located at a lower layer, a contact via passes through upper bit line pads against which it is isolated by dielectric sidewall spacers and to which it therefore does not establish electrical connection. Contrary to the drain node of each string which is shared only horizontally with other strings via a bit line pads but not vertically, the source node of each string is shared with adjacent strings that are located above or below it in a vertical direction.

Figure 3:
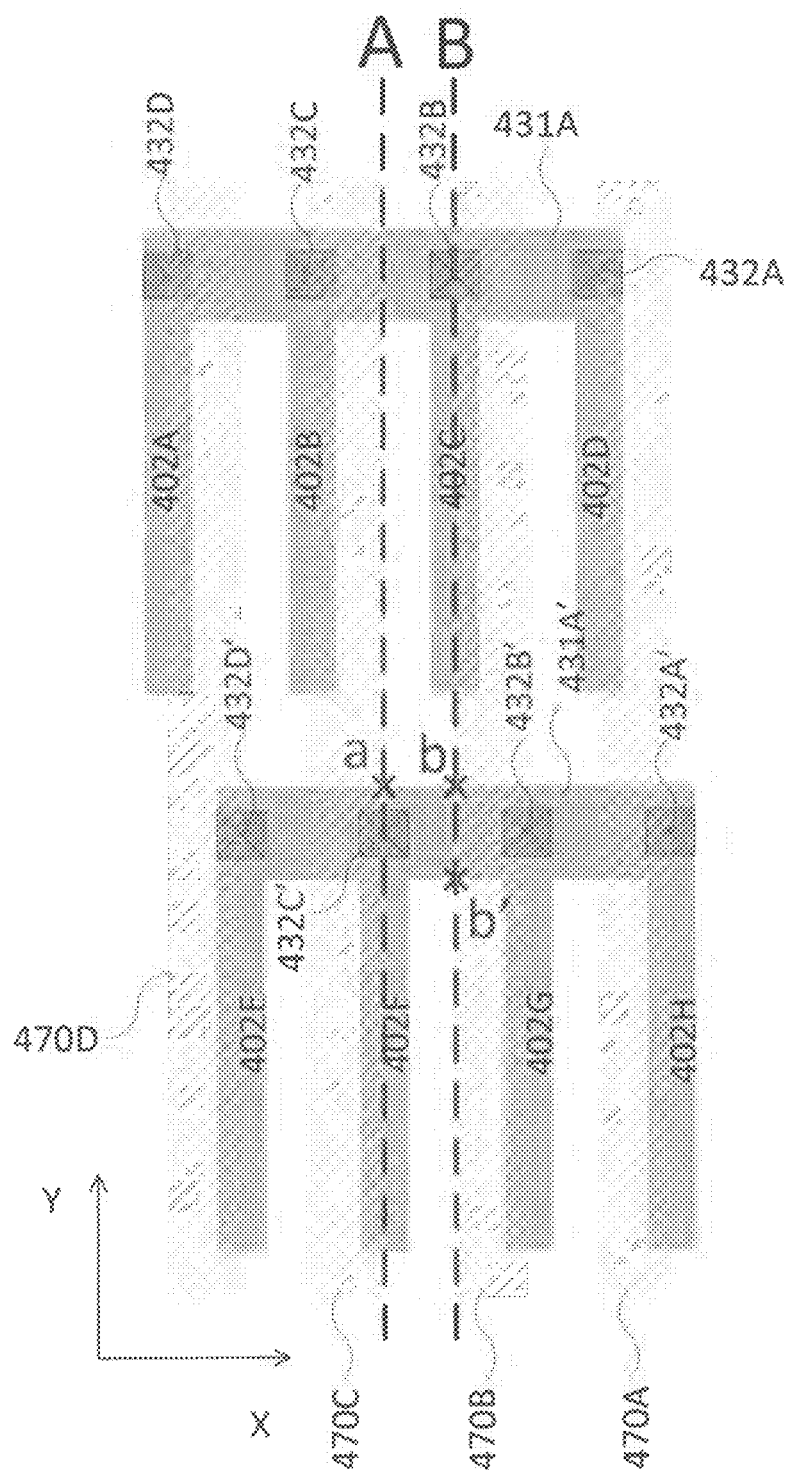
FIG. 3 shows a top view layout of two tiles of a VG NAND structure according to a first embodiment of the current disclosure.

FIG. 3 shows a top view of two tiles which are located in the y-direction relative to each other and connected to the same set of bit lines. The illustrated structure is repeated in the x and the y-direction. According to at least one example embodiment, the two tiles are aligned relative to each other in a way they are shifted in the x-direction by a half-pitch relative to the other. For the purposes of this disclosure a pitch relates to a distance from a point on one string to the same point on a next adjacent string. In certain embodiments, the distance relative may be more or less than a half pitch so long as certain portions of the strings are accessible. However, it will be appreciated that the more the relative distance deviates from half pitch, the less effective the relative offset becomes. This means that if a straight line is drawn along the y-direction, for example line A or B in FIG. 3, the line alternatingly cuts through a space between a string 402, and through a string 402. This means that at any x-coordinate, a bitline pad has a sidewall facing an inter-string space in either the positive or the negative y-direction.

For example in FIG. 3, all points along line A have the same x-coordinate. Looking at the lower bit line pad 431A' in the figure and its intersection with line A, it can be seen that point "a" which is located on a bit line pad sidewall faces a space between two stacked strings 402 in the upper (positive) y-direction. All points along line B also have the same x-coordinate. Looking again at the lower bit line pad in the figure and its intersection with line B, it can be seen that point "b" does not face a space between two strings in the upper (positive) y-direction, but a solid stack of strings. On the other hand, it can be seen instead that point "b'" faces a space between two strings in the lower (negative) y-direction. Thus there is at least one point (i.e. point b') on one of the sidewall of the lower bit line pad along line B which faces a space between two strings.

Other elements shown in FIG. 3 are bit lines 470A-470D and bit line contacts 432A-432D/432A'-432D' which connect bit lines individually to bit line pads 431A/431A' for each tile. Because the tiles are shifted by a half-pitch relative to each other, bit line contacts are not exactly aligned along a straight line in this embodiment. Nonetheless it does not pose a major problem to connect contacts to bit lines. In the illustrated example the bit lines do not fully overlap with the contacts but cover only half of each bit line contact. This amount of overlap is sufficient to establish electrical connectivity. However, it will be appreciated that this embodiment may be modified to take additional measures to improve the overlap between bit line contacts and bit lines.

Figure 4:
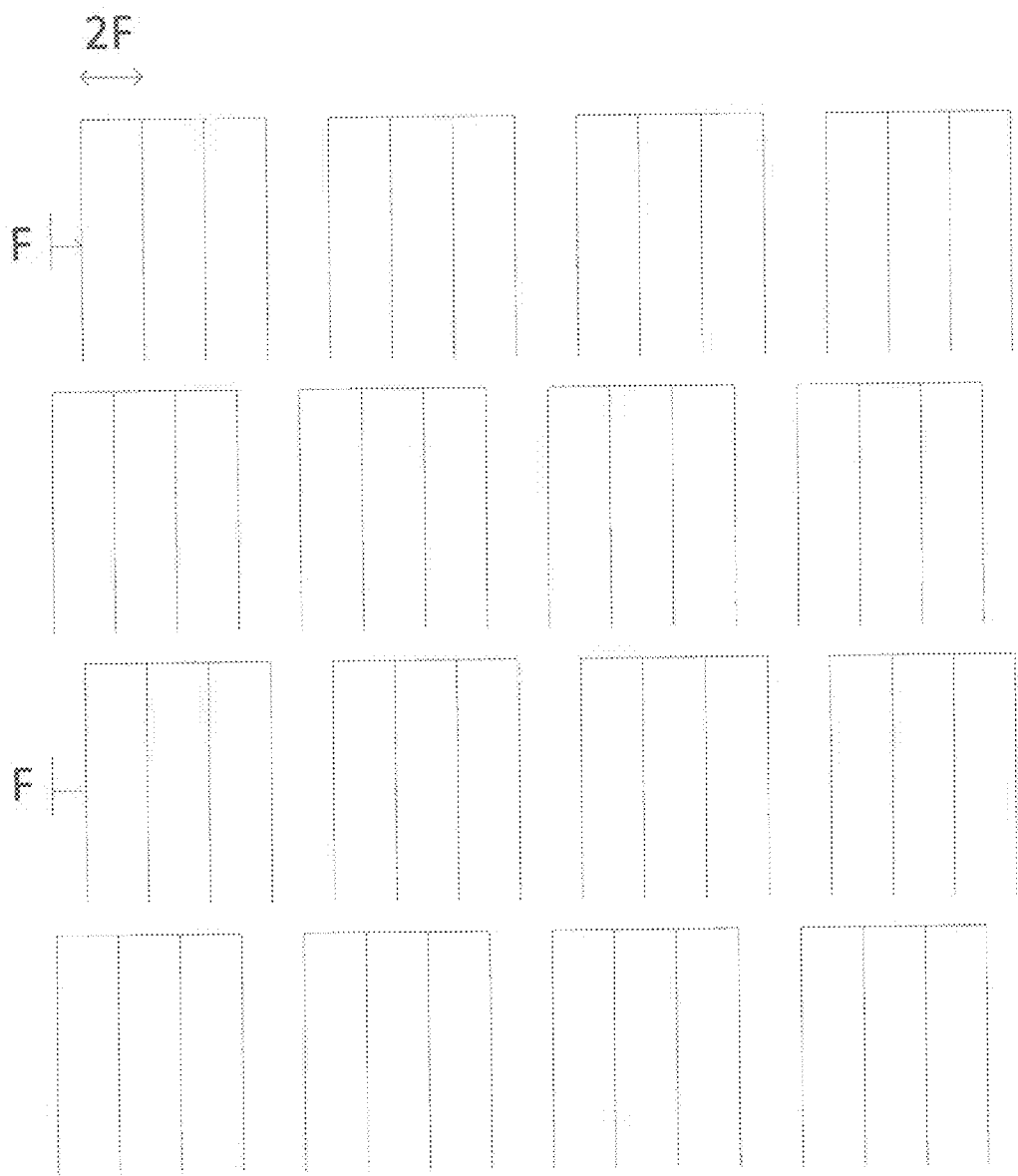
FIG. 4 shows a conceptual illustration of multiple tiles of a VG NAND structure according to a first embodiment of the current disclosure.

The illustrated structures are repeated in the x and the y-direction. This repetition is illustrated in FIG. 4, where strings and bit line pads are shown schematically as lines. Going in the y-direction it can be seen that tiles are shifted alternatingly in the x-direction by F, where 2F is the pitch of the strings.

Figure 5:
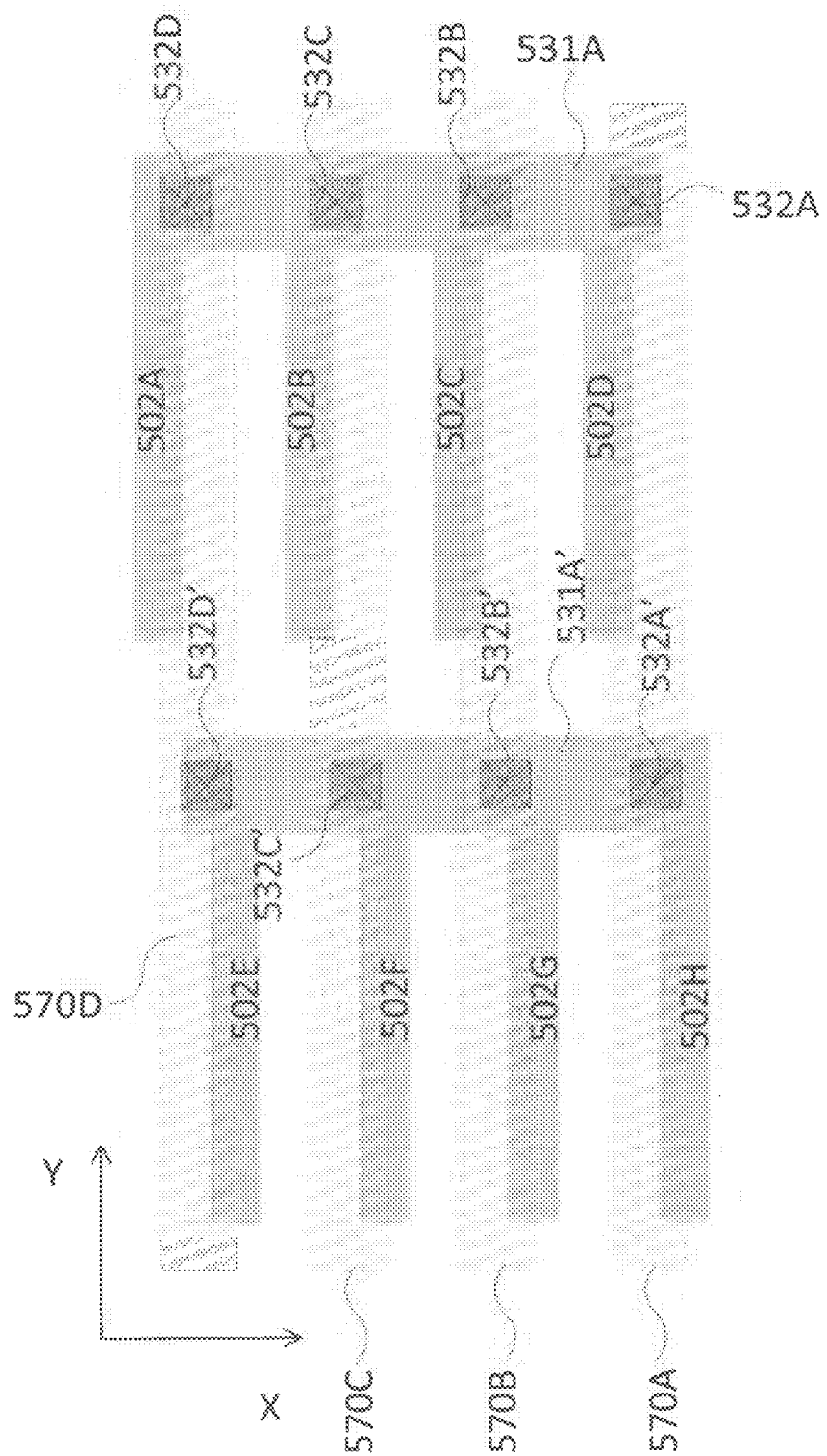
FIG. 5 shows a top view layout of two tiles of a VG NAND structure according to a second embodiment of the current disclosure.

Referring now to FIG. 5, another example showing a top view of two tiles which are located in the y-direction relative to each other and connected to the same set of bit lines is shown. With this example, full overlap is achieved by slightly shifting (when compared with the contacts shown in the embodiment of FIG. 3) the contacts 532 of a string 502 so that they completely overlap with respective bit lines 570 and extending the bit line pad 531 sideward.

Figure 6:
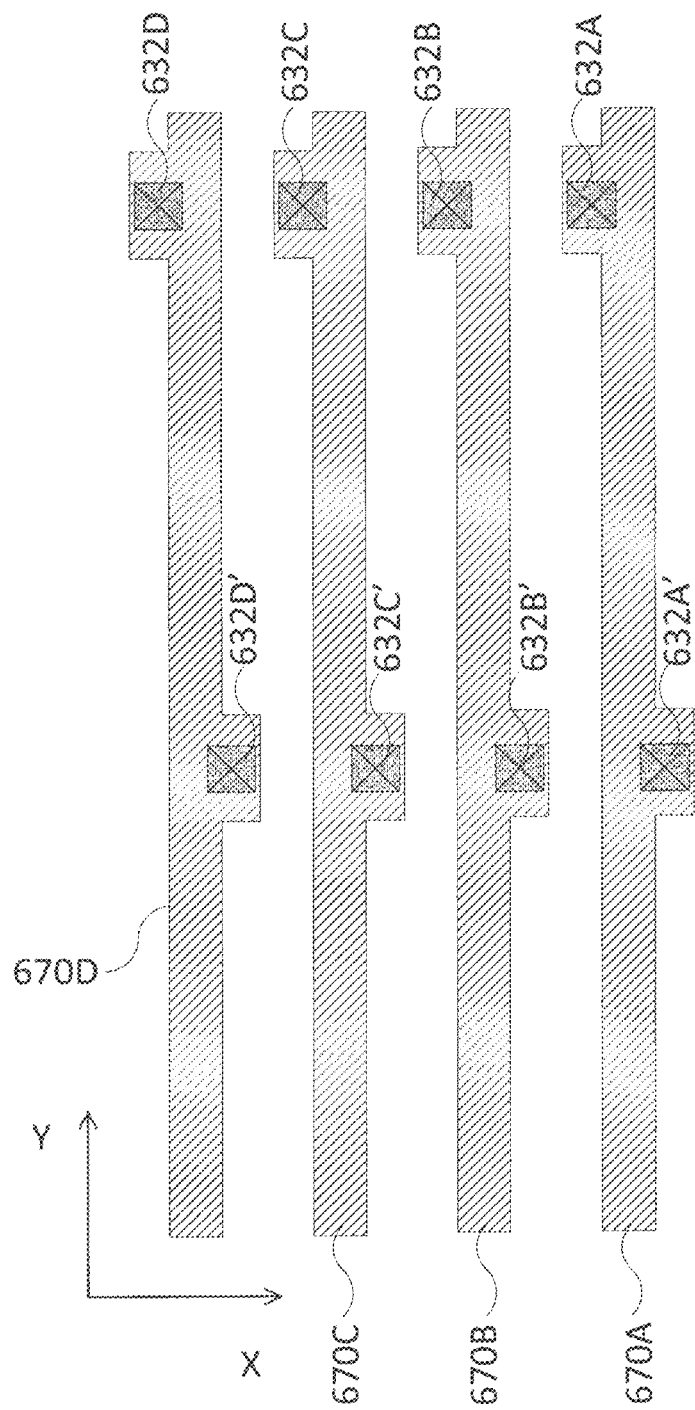
FIG. 6 shows a top view layout of two tiles of a VG NAND structure according to a third embodiment of the current disclosure for illustrating sideward extensions of bit lines.

Another layout is shown in FIG. 6, another example showing a top view of two tiles which are located in the y-direction relative to each other and connected to the same set of bit lines is shown. With the example embodiment shown in FIG. 6 only the bit lines 670 and bit line contacts 632 are shown for simplicity. The embodiment illustrated in FIG. 6 is substantially identical in all regards to the embodiment illustrated in FIG. 4, except for the pad-like sideward extensions of the bit lines which ensure full overlap of the bit lines with the bit line contacts.

Figure 7:
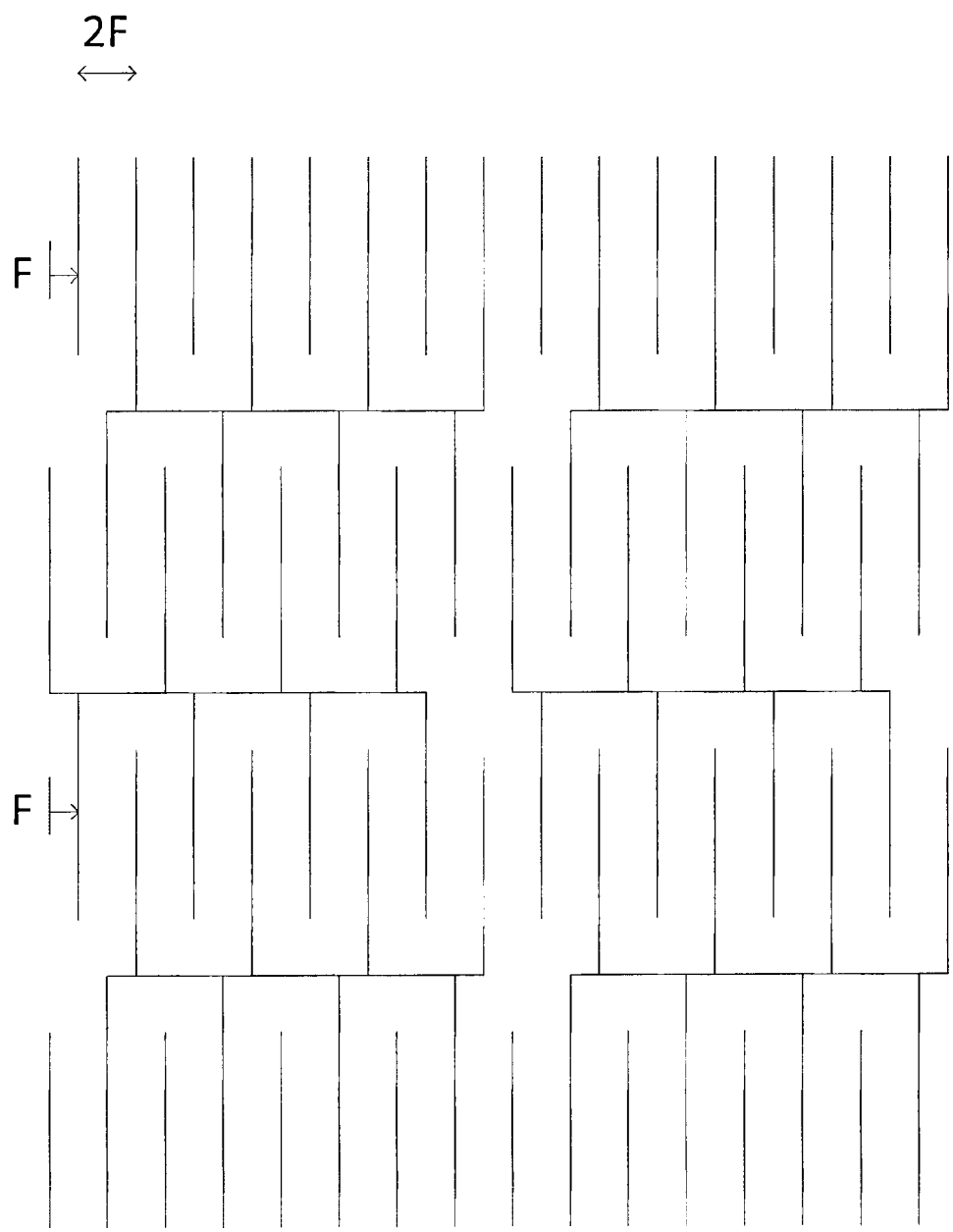
FIG. 7 shows a conceptual illustration of multiple tiles of a VG NAND structure according to a forth embodiment of the current disclosure with alternating even-odd string orientation.

Referring now to FIG. 7, another example showing strings and bit line pads schematically as lines is shown. In this example, the strings and bit lines are oriented with an even-odd string orientation as compared to the example shown in FIG. 4 where all strings are oriented in the same direction.

Figure 8:
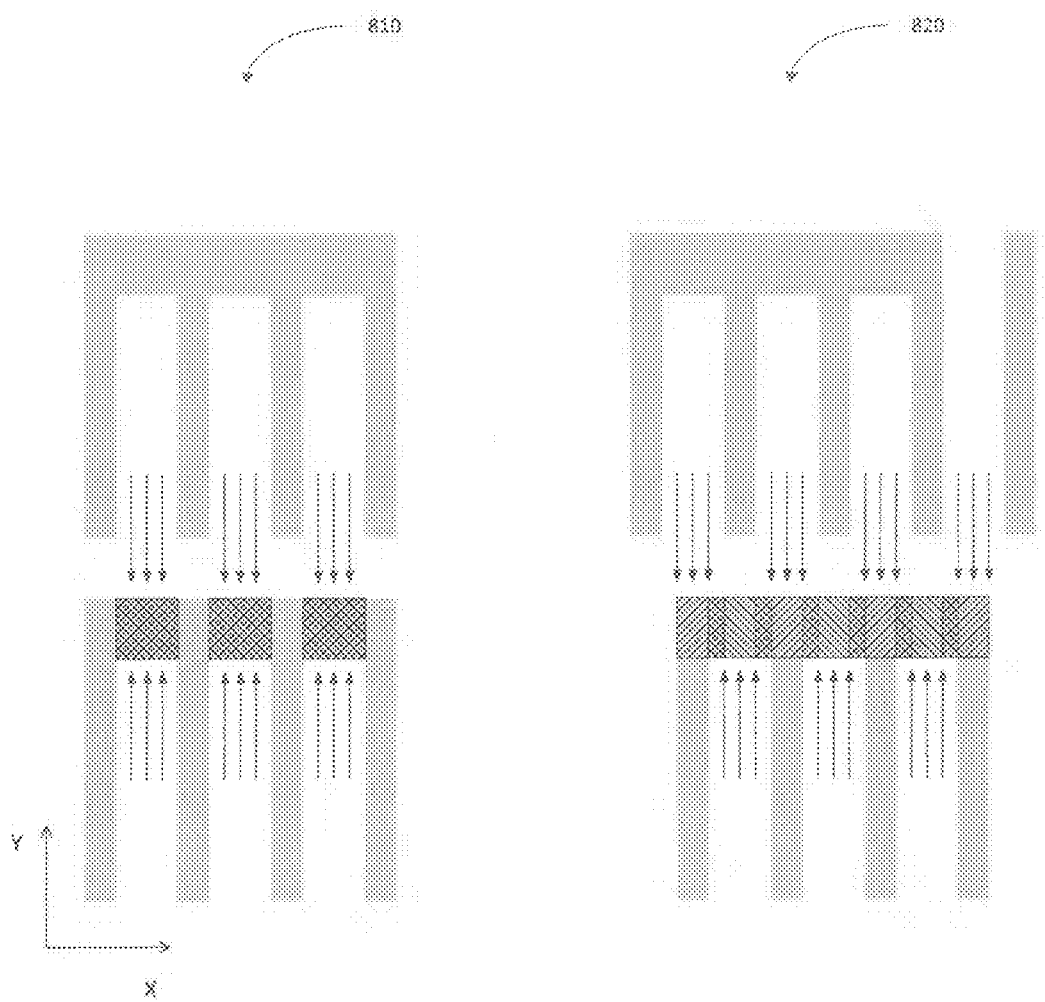
FIG. 8 shows an illustration of ion implant processes in top view for fabricating a known VG NAND structure and a VG NAND structure according to an embodiment of the disclosure.

Referring to FIG. 8, an illustration of ion implant processes in top view for fabricating a known VG NAND structure and a VG NAND structure in accordance with certain embodiments of the disclosure is shown. More specifically, the process 810 represents an ion implant processes in top view for fabricating a VG NAND structure according to certain known processes. The process 820 represents an ion implant processes in top view for fabricating a VG NAND structure according to certain embodiments of the disclosure. In FIG. 8, process 810 and process 820 show a top view of two tiles at a fabrication step when the ion implantation is performed on bit line pad sidewalls. The direction of the incoming tilted ion beam is shown as arrows. The regions within the bit line pads which are accessible to ion beams are shown as hatched regions. Regions that are implanted from the positive y-direction (downward pointing arrows) are shown as hatched regions with hatch line patterns running diagonally from the lower left to the upper right. Regions that are implanted from the negative y-direction (upward pointing arrows) are shown as hatched regions with hatch line patterns running diagonally from the upper left to the lower right. Overlapping regions that are implanted from the negative and the positive y-direction are shown as double hatched regions with hatch line patterns running diagonally from the upper left to the lower right and from the lower left to the upper right.

It will be appreciated that using the process 820 of the present disclosure the sidewalls of the bit line pads can be accessed by ion beams, because there exist free paths through the elongated spaces between adjacent stack strings. However, as shown in the known process 810 it is apparent that there may be some regions in the bit line pad which are masked from the ion beam by string stacks in both the positive and the negative y-direction.

In at least some example embodiments of the current disclosure the layout is friendly to sidewall ion implant processes, as the regions which are implanted from the positive y-direction and the negative y-direction naturally overlap with each other. Therefore the implanted regions are not disconnected from each other but form one connected n-type region throughout the bit line pad, which diminishes the need for any additional measures to decrease the bit line pad resistance.

Although the present invention has been described in detail, it should be understood that various changes, substitutions and alterations can be made hereto without departing from the spirit and scope of the invention as defined by the appended claims.

What is claimed is:

1. A non-volatile memory device, comprising:
a substrate;
a plurality of string stacks disposed over the substrate,
each string stack comprising a long axis and a short axis in a plane parallel to the substrate, the long axis extending along a y-direction and the short axis extending along an x-direction,
each string stack comprising a plurality of strings being stacked in a direction vertical to the substrate and having a first end and a second end at different locations in the y-direction,
the plurality of string stacks comprising a first and a second set of string stacks,
the first set of string stacks comprising at least two string stacks located at the same location in the y-direction and at different locations in the x-direction forming a repetitive pattern with a pitch A,
the second set of string stacks being adjacent to the first set of string stacks and comprising at least two string stacks located at the same location in the y-direction and at different locations in the x-direction forming a repetitive pattern with a pitch A,
the first set of string stacks and the second set of string stacks being at different locations in the y-direction,
at least some of the string stacks of the first set of string stacks being offset along the x-direction from at least some of the string stacks of the second set of string stacks by a distance B, the distance B being different from an integer multiple of the pitch A.

2. The non-volatile memory device of claim 1, wherein the non-volatile memory device is a NAND Flash device.

3. The nonvolatile memory device of claim 1, comprising:
a plurality of pads disposed over the substrate,
each pad having at least a first and a second sidewall,
each of the first sidewalls facing a same direction relative to other first sidewalls,
the first sidewalls facing directions opposite the second sidewalls, and,
the first and second sidewalls facing directions parallel to the y-direction.

4. The non-volatile memory device of claim 3, wherein:
the pads are bit line pads, each bit line pad being electrically connected to a bit line.

5. The non-volatile memory device of claim 3, wherein:
the pads are source line pads.

6. The non-volatile memory device of claim 3, wherein:
the plurality of pads comprises at least a first and a second stack of pads,
each stack of pads comprising a plurality of pads being stacked in a direction vertical to the substrate.

7. The non-volatile memory device of claim 6, wherein:
the first set of string stacks is connected to the first stack of pads,
the second set of string stacks is connected to the second stack of pads,
each string stack of the first set of string stacks being oriented in the same y-direction.

8. The non-volatile memory device of claim 7, wherein:
each of the first sidewalls of the first stack of pads is disposed to face a space between at least two string stacks of the second set of string stacks.

9. The non-volatile memory device of claim 6, wherein:
the first set of string stacks is connected to the first stack of pads,
the second set of string stacks is connected to the first stack of pads,
the string stacks of the first and the second set of string stacks are oriented in opposite directions to form an alternating even-odd orientation.

10. The non-volatile memory device of claim 9, wherein:
each of the first sidewalls of the first stack of pads is disposed to face a space between at least two string stacks of the second set of string stacks.

11. The non-volatile memory device of claim 1, wherein:
the distance B is substantially half of the pitch A.

12. The non-volatile memory device of claim 3, wherein:
portions of the plurality of pads are fabricated using a tilted ion beam bombardment.

* * * * *